July 9, 1974 J. R. FASSETT 3,823,015

PHOTO-MASKING PROCESS

Filed Jan. 2, 1973 3 Sheets-Sheet 1

July 9, 1974 | J. R. FASSETT | 3,823,015

PHOTO-MASKING PROCESS

Filed Jan. 2, 1973 | 3 Sheets-Sheet 3

3,823,015

PHOTO-MASKING PROCESS

John R. Fassett, Irvine, Calif., assignor to Collins Radio Company, Dallas, Tex.

Filed Jan. 2, 1973, Ser. No. 320,363
Int. Cl. G03c 5/00
U.S. Cl. 96—36 10 Claims

ABSTRACT OF THE DISCLOSURE

A method of pattern definition employing photoresist masking techniques useful in photoengraving generally and in semiconductor processing specifically wherein defects due to inherent mask flaws are minimized and mask tolerance is improved including the steps of thrice defining and etching a pattern definition layer using separate photo masks or, where possible, by indexing the same photo mask whereby flaws in the masks do not coincide.

This invention relates generally to photo-reproducing processes, and more particularly to photoresist and etch processes as employed in the manufacture of semiconductor electronic devices and printed circuits. The invention also has applicability in producing flawless photo plates and plates for photoengraving.

As is well appreciated in the field of electronics, semiconductor technology allows microminiaturization of circuits and systems by employing integrated semiconductor circuits. The integrated circuit comprises active and passive devices which are embodied in a selectively doped monolithic semiconductor substrate. Advancement in the art of microminiaturization has led to large-scale integration (LSI) wherein a complex circuit array may be defined in a single substrate.

In fabricating such an array, photoresist masking and etching techniques are employed wherein the circuit is defined through use of a plurality of photo masks which are used in selectively developing the photoresist for subsequent oxide etching, dopant diffusion into the exposed substrate, and metalization. Conventionally, to form an oxide diffusion mask the semiconductor substrate is provided with an oxide surface layer of sufficient thickness (e.g., 2,000 A) to be impervious to dopant diffusion. Diffusion windows are selectively cut through the oxide layer by a photoresist masking and etching process wherein a photoresist layer is provided over the oxide surface, the desired diffusion pattern is developed in the photoresist using the photo mask, the undeveloped photoresist is removed from the desired diffusion window areas, and then the exposed oxide in the window areas is removed by suitable etchant. The developed photoresist protects the covered oxide surface from the etchants and is removed after the oxide etching and prior to the diffusion step.

Limitations in the microminiaturization process lie in pattern definition and mask alignment. For example, small flaws often appear in masks wherein a dark spot may appear in a desired light area or conversely a light spot may appear in a desired dark area. Such flaws can be caused by various forms of particulate matter such as dust during the exposure of photosensitive material or by flaws within the photosensitive material. Additionally, in aligning masks conventionally a tolerance of ±50 microinches must be provided. This, of course, limits the density of circuits per unit area.

A primary object of the present invention is the reduction of flaws in photo-reproducing processes.

Another object of the invention is reduction of flaws through redundant techniques without affecting image line width.

Still another object of the invention is the increase in production yield of operable semiconductor devices and circuits.

In accordance with the present invention, in defining a circuit pattern on a semiconductor wafer a protective coating of silicon oxide or the like is provided with a thickness of at least twice the minimum required for diffusion protection. Oxide removal for diffusion is accomplished by etching the oxide thrice using conventional photoresist masking and etching process. However, in each etching the photoresist mask is indexed (if the same circuit pattern is repeated a number of times in rows and columns thereon) or different masks are employed, whereby inherent flaws in the photo mask do not coincide in each masking step. In photoengraving a pattern on a substrate wherein a protective layer and the substrate are susceptible to different etchants, a similar pattern definition process is employed by thrice etching the protective layer.

The invention and other objects and features thereof will be more fully understood from the following detailed description and appended claims when taken with the drawing, in which:

Figure 1:
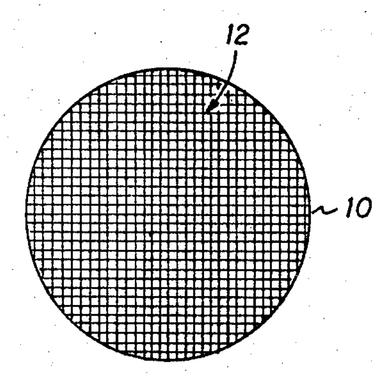
FIG. 1 is a plan view of a large-scale integrated semiconductor array.

Referring now to the drawings, FIG. 1 is a plan view of a semiconductor wafer 10 containing a plurality of like arrays 12 illustrated by the mesh pattern comprising a plurality of rows and columns of circuits. In fabricating such devices, conventional photoresist masking and eaching techniques are employed wherein a photoresist mask defining portions of the plurality of circuits is utilized in defining regions on the wafer for oxide removal and subsequent dopant diffusion or for metalization patterns.

Figure 2:
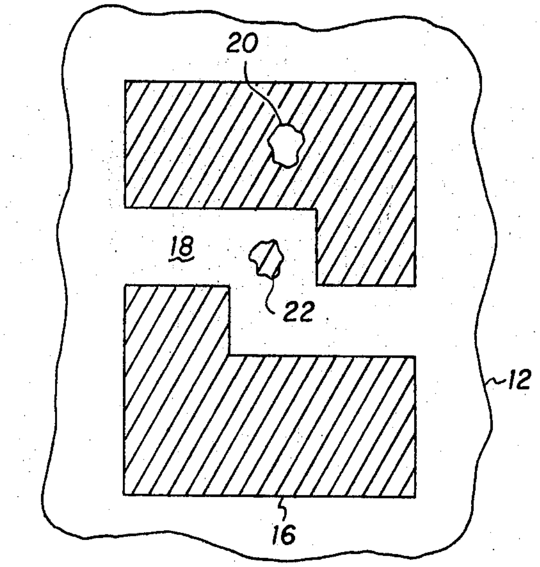
FIG. 2 is a plan view of a portion of the array of FIG. 1.

Referring to FIG. 2, a portion of an array in wafer 10 of FIG. 1 is shown including diffused regions 14 and 16 which are separated by a region 18. Illustrated in diffused region 14 is a flaw 20 resulting from a dark spot in the diffusion mask used to define region 14 for diffusion. Similarly, in region 18 is a flaw 22 resulting from a pinhole or light spot in the diffusion mask which allowed the consequent diffusion of flaw 22. Such defects could disrupt desired current flow or cause shorting of current paths in the defined circuit.

In accordance with the present invention, defects arising through imperfections in the photoresist mask are eliminated or minimized through use of a plural mask definition and etch step. For example, a minimum oxide thickness of 2,000 angstroms is required to prevent dopant diffusion therethrough. Conventionally, an oxide thickness in excess of the 2,000 angstroms would be provided on the wafer surface and diffusion windows defined through a single etching step. In accordance with the present invention an oxide thickness in excess of 4,000 angstroms or twice the thickness required for diffusion masking, is provided, a first etchant pattern is defined and one-half of the oxide thickness is removed. Thereafter, a second photoresist mask of the same pattern is employed to again define the etchant pattern and one-half of the original oxide thickness is again removed by etching. When the desired circuit configuration comprises a repetition of the same circuit arranged in rows and columns, the second mask pattern may entail the original mask but with the pattern indexed at least one row or one column, whereby flaws in the mask will not overlap. Finally, a third pattern is developed and again the oxide is etched to remove one-half of the original oxide thickness, if present.

To illustrate the present invention consider the three photo regions 20 and 22 with a clear region 24 for defining a diffusion window in a semiconductor substrate. Within transparent region 24 is a dark flaw 26 and within opaque region 22 is a clear or pinhole flaw 28. As described above, such flaws may occur as a result of extraneous particulate matter or flaws within the photo mask material. Mask B and mask C are of similar pattern definition and it is assumed in each of these masks that similar flaws 26' and 28' occur in mask B and 26'' and 28'' occurs in mask C. However, it is assumed that these flaws occur randomly and that none of the flaws correspond to the same locations in each of the masks.

Figure 3A:
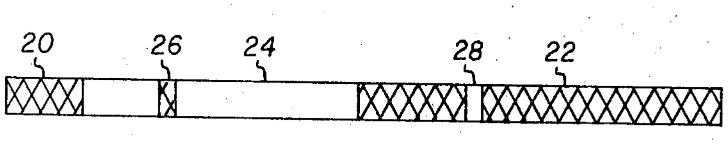
FIG. 3 is a section view of three photo masks including defects.
Figure 3B:
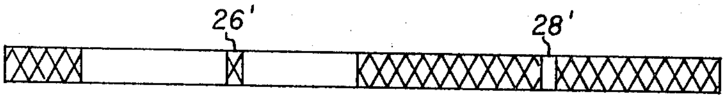
Figure 3C:
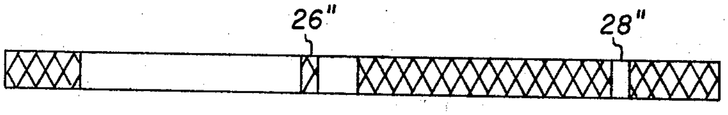
Figure 4:
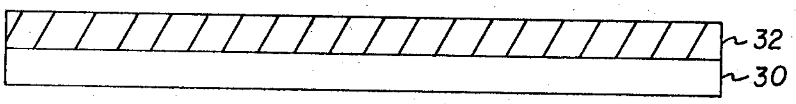
FIG. 4 is a section view of a semiconductor substrate and oxide layer.
Figure 5A:
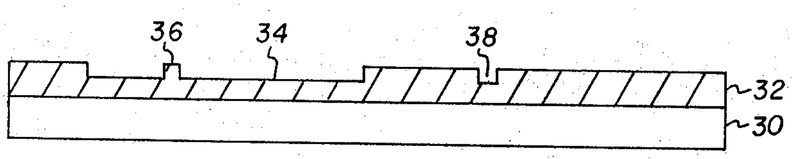
FIG. 5 is a section view illustrating the present invention using the masks of FIG. 3 to process the substrate of FIG. 4.

Consider now the method of defining an etchant window in the oxide masked wafer of FIG. 4 using the three masks of FIG. 3 all in accordance with the present invention. In FIG. 4 a semiconductor substrate 30 is provided with an oxide layer 32 of approximately 4,000 angstrom thickness. Using each of the masks, one-half of the original oxide thickness will be removed in three etching steps illustrated in FIG. 5. In view A of FIG. 5 mask A of FIG. 3 is employed to develop photoresist and etch half of the oxide layer 32 as illustrated. Region 34, corresponding to transparent region 24 of mask A is etched halfway in layer 32 with flaw 36, corresponding to the opaque flaw 26 in transparent region 24 of mask A appearing therein. Further, region 38 is etched as a result of the flaw 28 in the opaque region 22 of mask A. The first etching step illustrated in FIG. 5A removes one-half of the oxide thickness in the etched regions, leaving approximately 2,000 angstroms thickness of oxide which is sufficient as a diffusion mask.

Figure 5B:
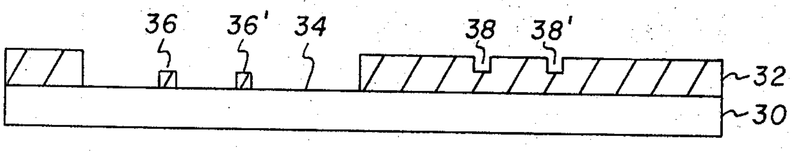

A second diffusion window is defined on the wafer utilizing the mask B of FIG. 3 and again one-half of the original oxide thickness is removed as illustrated in FIG. 5B. Region 34 is fully defined after the second etching step except for the original flaw 36 which is reduced in size and the flaw 36' resulting from the flaw 26' in mask B in FIG. 3. Further, a second etched region 38' occurs in layer 32 as a result of the flaw 28' in the mask of FIG. 3B, but as above described sufficient oxide remains to provide diffusion masking.

Figure 5C:
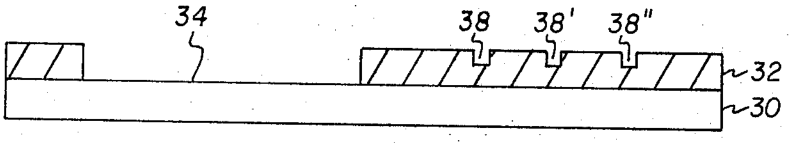
Figure 6A:
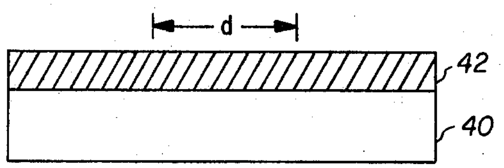
FIG. 6 is a section view of a portion of a semiconductor wafer further illustrating the photoresist definition process in accordance with the present invention.
Figure 6B:
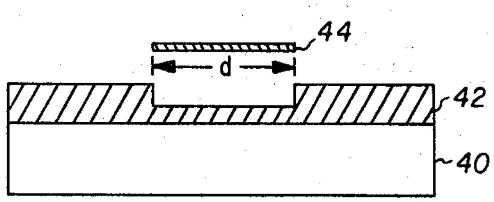
Figure 6C:
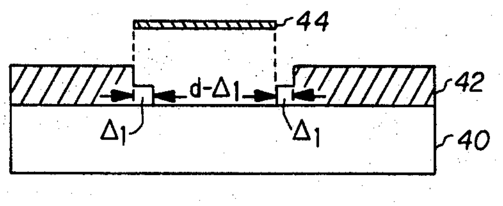
Figure 6D:
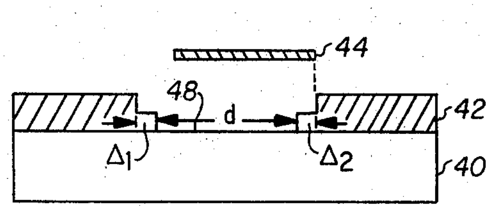

Finally, the thick mask of FIG. 3C is employed for the third photoresist definition and etching step illustrated in FIG. 5C. After this third etching step window 34 is fully defined with no flaws therein as a result of the third etching step eliminating flaws 36 and 36'. The flaw 26'' occurring in the mask of FIG. 3C is not imparted in the final etched wafer of FIG. 5C since the second etchant step illustrated in FIG. 5B had eliminated all oxide from this area. It will be noted that a third etched region 38'' occurs in the oxide layer 32 as a result of the flaw 28'' of the mask of FIG. 3C.

Thus, by employing three separate masks as shown in FIG. 3 and employing the three-step etching process in accordance with the present invention, as illustrated in FIG. 5, the flaws in the masks of FIG. 3 are not imparted to the final etched wafer of FIG. 5C. Subsequent diffusion of dopant impurities into the wafer of FIG. 5C results in the desired doped regions without flaws.

Importantly, flaws are minimized through the triple etching process, but the desired image line width is not comprised. This aspect of the invention is illustrated in the section views of FIG. C.

Referring to FIG. 6, view A is a section view of a semiconductor substrate 40 with oxide layer 42 overlaying a major surface. For illustration purposes, it is assumed that a diffusion window of width, *d*, without flaws is desired.

In view B, a first pattern of width, *d*, is defined and etched using photo-mark 44. In accordance with the invention, approximately one-half of the original oxide thickness is removed in this first etching.

In view C, a second pattern is defined using mask 44, but it is assumed that mask alignment error moves the mask to the left by an error of $\Delta_1$. Thus, the second etching removes one-half of the original oxide thickness whereby all of the oxide is removed in the area where the first and second patterns overlap, and mesas remain on either side thereof each having a width, $\Delta_1$.

In view D, a third pattern is formed using mask 44, and it is assumed that the mask alignment error is $\Delta_2$ to the right. Again, the third pattern is etched to remove one-half of the original oxide thickness, if present, thereby providing the desired diffusion window 48 without flaws and having the desired width, *d*.

Another advantage of the process, as illustrated in FIG. 6, is that the worst mask line-up error is eliminated. This is particularly advantageous where the desired pattern must be positioned as accurately as possible with respect to an established layout on the substrate.

While the three mask definition and etch process as described above incrementally increases total process cost, and the increase in yield through minimizing inherent flaws and alignment tolerances more than offsets the increase. Higher yields have, in fact, resulted through employment of the process. Moreover, the plural mask definition and the etch process is compatible with conventional semiconductor processing.

While the invention has been described with reference to specific embodiments, the description is illustrative and is not to be construed as limiting the invention. Various modifications and changes may occur to those skilled in the art without departing from the true spirit and scope of the invention as defined by the appended claims.

I claim:

1. The method of defining a pattern on a substrate using photoresist masking techniques wherein photolithographic process defects are minimized comprising the steps of:

(a) providing an etchable pattern definition layer of at least twice the minimum thickness required for subsequent substrate processing;

(b) defining a first pattern on said pattern definition layer through photoresist masking utilizing a first photomask pattern and a first photoresist layer;

(c) etching away approximately half of said pattern definition layer thickness through said first pattern;

(d) defining a second pattern corresponding to said first pattern on said pattern definition layer through photoresist masking utilizing a second photomask pattern and a second photoresist layer;

(e) etching away approximately half of said pattern definition layer thickness through said second pattern·

(f) defining a third pattern corresponding to said first and second patterns on said pattern definition layer through photoresist masking utilizing a third photomask pattern and a third photoresist layer; and (g) etching the remaining exposed pattern definition layer up to approximately half of said original layer thickness through said third pattern.

2. The method of Claim 1 for photoengraving wherein said pattern definition layer and said substrate are susceptible to different etchants.

3. The method of Claim 2 wherein said first, second, and third patterns are defined by separate photo masks.

4. The method of Claim 2 wherein said first pattern is defined by a first photo mask and said second and third patterns are defined by indexing said first photo mask.

5. The method of Claim 1 for processing a semiconductor wafer wherein said pattern definition layer is a semiconductor oxide.

6. The method of Claim 5 wherein said first, second, and third patterns are defined by separate photo masks.

7. The method of Claim 5 wherein said first pattern is defined by a first photo mask and said second and third patterns are defined by indexing said first photo mask.

8. In the fabrication of integrated circuits in a semiconductor wafer, the method of defining diffusion windows through an oxide layer on said wafer comprising the steps of:

(a) providing an oxide layer on said wafer of at least twice the minimum thickness required for diffusion protection;
(b) defining a first pattern of diffusion windows on said oxide layer through photoresist masking;
(c) etching approximately half of said oxide layer thickness through said first pattern of diffusion windows;
(d) defining a second pattern of diffusion windows corresponding to said first pattern on said oxide layer through photoresist masking;
(e) etching approximately half of said oxide layer thickness through said second pattern of diffusion windows.
(f) defining a third pattern of diffusion windows corresponding to said first and second patterns on said oxide layer through photoresist masking; and
(g) etching the remaining exposed oxide up to approximately half of said oxide layer thickness through said third pattern of diffusion windows.

9. The method defined by Claim 1 wherein said first, second, and third patterns are defined by separate photo masks.

10. The method defined by Claim 1 wherein said first pattern is defined by a first photo mask and said second and third patterns are defined by indexing said first photo mask with respect to said first defined pattern.

References Cited

UNITED STATES PATENTS

| | | | |
|---|---|---|---|
| 3,317,320 | 5/1967 | Reber | 96—36.2 |
| 3,518,084 | 6/1970 | Barson et al. | 96—36.2 |
| 3,647,445 | 3/1972 | Burns | 96—36.2 |
| 3,615,464 | 10/1971 | Agusta et al. | 96—44 |
| 3,598,604 | 8/1971 | DePuy | 96—44 |
| 3,649,392 | 3/1972 | Schneck | 156—17 |
| 3,498,833 | 3/1970 | Lehrer | 156—17 |
| 3,518,131 | 6/1970 | Glendinning | 156—17 |
| 3,476,561 | 11/1969 | Bertelsen et al. | 96—36.2 |

RONALD H. SMITH, Primary Examiner

E. C. KIMLIN, Assistant Examiner

U.S. Cl. X.R.

96—362; 156—11, 17